(12) United States Patent
Yang et al.

(10) Patent No.: US 8,232,196 B2
(45) Date of Patent: Jul. 31, 2012

(54) INTERCONNECT STRUCTURE HAVING A VIA WITH A VIA GOUGING FEATURE AND DIELECTRIC LINER SIDEWALLS FOR BEOL INTEGRATION

(75) Inventors: Chih-Chao Yang, Albany, NY (US); Chao-Kun Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 12/608,377

(22) Filed: Oct. 29, 2009

(65) Prior Publication Data
US 2011/0100697 A1    May 5, 2011

(51) Int. Cl.
*H01L 21/4763* (2006.01)
(52) U.S. Cl. ........ 438/622; 438/618; 438/637; 257/774; 257/E23.145
(58) Field of Classification Search .................. 438/618, 438/622, 626–629, 637; 257/774, E23.145
See application file for complete search history.

(56) References Cited

U.S. PATENT DOCUMENTS

| 7,122,462 | B2 | 10/2006 | Clevenger et al. |
| 7,488,679 | B2 | 2/2009 | Standaert et al. |
| 7,528,066 | B2 | 5/2009 | Yang et al. |
| 7,994,055 | B2 * | 8/2011 | Sakai et al. .................. 438/687 |
| 2007/0205482 | A1 | 9/2007 | Yang et al. |
| 2008/0012142 | A1 | 1/2008 | Mehta et al. |
| 2009/0079077 | A1 | 3/2009 | Yang et al. |
| 2009/0194876 | A1 | 8/2009 | Yang et al. |

* cited by examiner

*Primary Examiner* — David Vu
(74) *Attorney, Agent, or Firm* — Wenjie Li

(57) ABSTRACT

An interconnect structure including a lower interconnect level with a first dielectric layer having a first conductive material embedded therein; a dielectric capping layer located on the first dielectric layer and some portions of the first conductive material; an upper interconnect level including a second dielectric layer having at least one via opening filled with a second conductive material and at least one overlying line opening filled with the second conductive material disposed therein, wherein the at least one via opening is in contact with the first conductive material in the lower interconnect level by a via gouging feature; a dielectric liner on sidewalls of the at least one via opening; and a first diffusion barrier layer on sidewalls and a bottom of both the at least one via opening and the at least one overlying line opening. A method of forming the interconnect structure is also provided.

14 Claims, 9 Drawing Sheets

INTERCONNECT STRUCTURE HAVING A VIA WITH A VIA GOUGING FEATURE AND DIELECTRIC LINER SIDEWALLS FOR BEOL INTEGRATION

FIELD OF THE INVENTION

The present invention relates to a semiconductor interconnect structure, and a method of fabricating the same. More particularly, the present invention relates to a semiconductor interconnect structure in which at least one via has a via gouging feature and dielectric liner sidewalls. The present invention also provides a method of forming such an interconnect structure.

BACKGROUND OF THE INVENTION

Manufacture of a semiconductor device is normally divided into two major phases. The "front end of the line" (FEOL) is dedicated to the creation of all the transistors in the body of the semiconductor device, and the "back end of the line" (BEOL) creates the metal interconnect structures, which connect all the transistors with each other as well as with the external world. The FEOL consists of a repeated sequence of steps that modifies the electrical properties of part of a wafer surface and grows new material above selected regions. Once all active components are created, the second phase of manufacturing (BEOL) begins. During the BEOL, metal interconnects are created to establish the connection pattern of the semiconductor device.

Semiconductor devices generally include a plurality of circuits which form an integrated circuit fabricated on a semiconductor substrate. To improve the performance of the circuits, low k dielectric materials having a dielectric constant of less than silicon dioxide, such as porous dielectric materials, have been used as inter-layer dielectric (ILD) to further reduce capacitance. Interconnect structures made of metal lines or vias are usually formed in and around the porous dielectric material ILD to connect elements of the circuits. An interconnect structure may consist of multilevel or multilayered schemes, such as, for example, single or dual damascene wiring structures. Within a typical interconnect structure, metal lines run parallel to the semiconductor substrate, while metal vias run perpendicular to the semiconductor substrate.

The quality of the metal lines and metal vias is extremely important to ensure yield and reliability. The major problem encountered in this area today is poor mechanical strength of deep submicron metal contacts (lines and vias) embedded in low k dielectric materials, which can cause unsatisfied thermal cycling and stress migration resistance in the interconnect structures. This problem becomes more severe when new metallization approaches or porous low k dielectric materials are used.

To solve the weak mechanical strength issue while employing copper damascene and low k dielectric materials in an interconnect structure, a so called "via punch-through" technique has been adopted by the semiconductor industry. The "via punch-through" technique provides a via gouging feature as anchoring area within the lower part of the interconnect structure. The via gouging feature helps to achieve an improved electrical contact resistance as well as a reasonable reliability requirement through increasing mechanical strength of the metal contacts.

FIGS. 1A-1E illustrate processing steps of a conventional process for forming an interconnect structure with a via gouging feature. FIG. 1A illustrates a prior art interconnect structure that is formed after a dual damascene patterning process. The interconnect structure has an upper interconnect level 108 which is located atop a lower interconnect level 100. The lower interconnect level 100 includes a first dielectric material 102 and a copper interconnect 104. The lower interconnect level 100 is separated in part from the upper interconnect level 108 by a dielectric capping layer 106. The upper interconnect level 108 includes a second dielectric material 110 that includes both line openings 112 and a via opening 114 located therein. A top surface of the copper interconnect 104 of the lower interconnect level 100 that is beneath the via opening 114 is exposed.

In FIG. 1B, a diffusion barrier 116, such as TaN, is formed over all of the exposed surfaces, including the sidewalls and bottom horizontal surfaces of the line openings 112 and the via opening 114. In FIG. 1C, argon sputtering is used to clean the bottom horizontal surface of the via opening 114 and to form a gouging feature 118 into the copper interconnect 104 of the lower interconnect level 100. The gouging feature 118 enhances the interconnect strength between the various interconnect levels shown. As shown in FIG. 1C, during the argon sputtering process, the diffusion barrier located at the bottom horizontal surface of each of the line openings 112 is also removed. Due to the inherent aggressive nature of the argon sputtering process, dielectric damages 120 are also formed in the second dielectric material 110 near the bottom of each of the line openings 112.

FIG. 1D shows the prior art interconnect structure of FIG. 1C after forming a metal liner layer 122 on all of the exposed surfaces. In FIG. 1E, the line openings 112 and the via opening 114 are filled with a conductive metal 124, such as copper. As shown in FIG. 1E, the prior art interconnect structure has poor diffusion barrier coverage and a bottom roughness at the bottom of the metal filled lines 112 (designated by reference numeral 126), as a result of the dielectric damages 120 formed into the second low k dielectric material 110. Both of these characteristics reduce the quality of the diffusion barrier 116 and degrade the overall wiring reliability.

SUMMARY OF THE INVENTION

The present invention provides a semiconductor interconnect structure in which at least one via has a via gouging feature and dielectric liner sidewalls. The present invention also provides a method of forming such an interconnect structure. The interconnect structure of the present invention provides improved wiring reliability as compared to conventional interconnect structures mentioned above.

A first embodiment introduces a method of forming an interconnect structure. The method includes the steps of providing an initial interconnect structure that includes a lower interconnect level comprising a first dielectric layer having a first conductive material embedded therein, an upper interconnect level comprising a second dielectric layer having at least one via opening that exposes a portion of the first conductive material located atop the lower interconnect level, the lower and upper interconnect levels are separated in part by a dielectric capping layer, and a patterned hard mask on a surface of the upper interconnect level; removing an exposed portion of the conductive material to form at least one via gouging feature within the conductive material at a bottom of the at least one via opening; forming a dielectric liner layer on all exposed surfaces; forming at least one line opening in the second dielectric layer that extends above the at least one via opening; selectively removing the dielectric liner layer from the at least one via gouging feature while keeping at least a portion of the dielectric liner layer at sidewalls of the at least one via opening unremoved; forming a first diffusion barrier layer on all exposed surfaces; and filling the at least one line opening and at least one via opening with a second conductive material.

A second embodiment introduces an interconnect structure including a lower interconnect level including a first dielectric layer having a first conductive material embedded therein; a dielectric capping layer located on the first dielectric layer and some, but not all, portions of the first conductive material; an upper interconnect level including a second dielectric layer having at least one via opening filled with a second conductive material and at least one overlying line opening filled with the second conductive material disposed therein, wherein the at least one via opening is in contact with the first conductive material in the lower interconnect level by a via gouging feature; a dielectric liner on sidewalls of the at least one via opening; and a first diffusion barrier layer on sidewalls and a bottom of both the at least one via opening and the at least one overlying line opening.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1A:
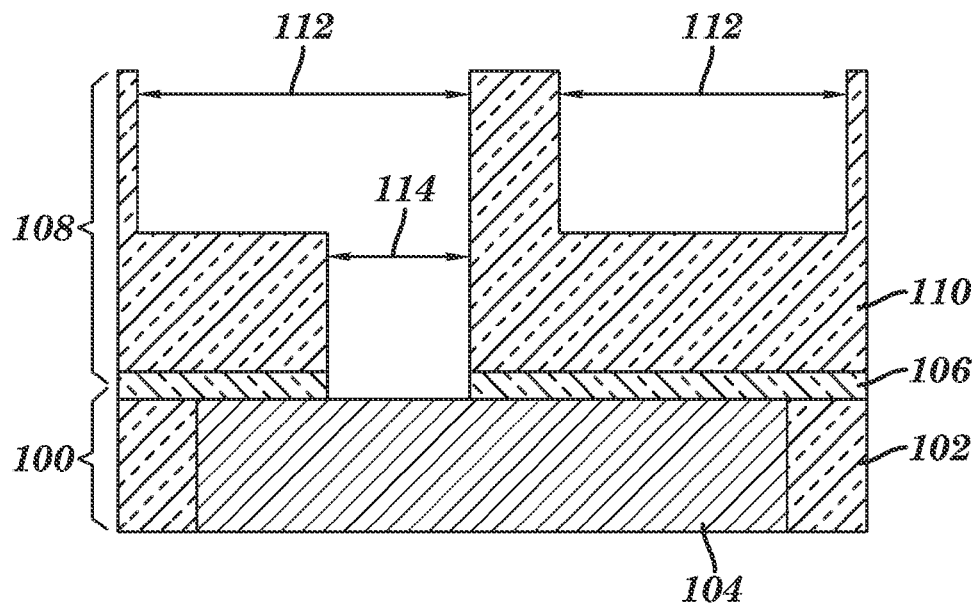
FIGS. 1A-1E are cross-sectional views that illustrate the basic processing steps used in the prior art for forming an interconnect structure including at least one via gouging feature.
Figure 1B:
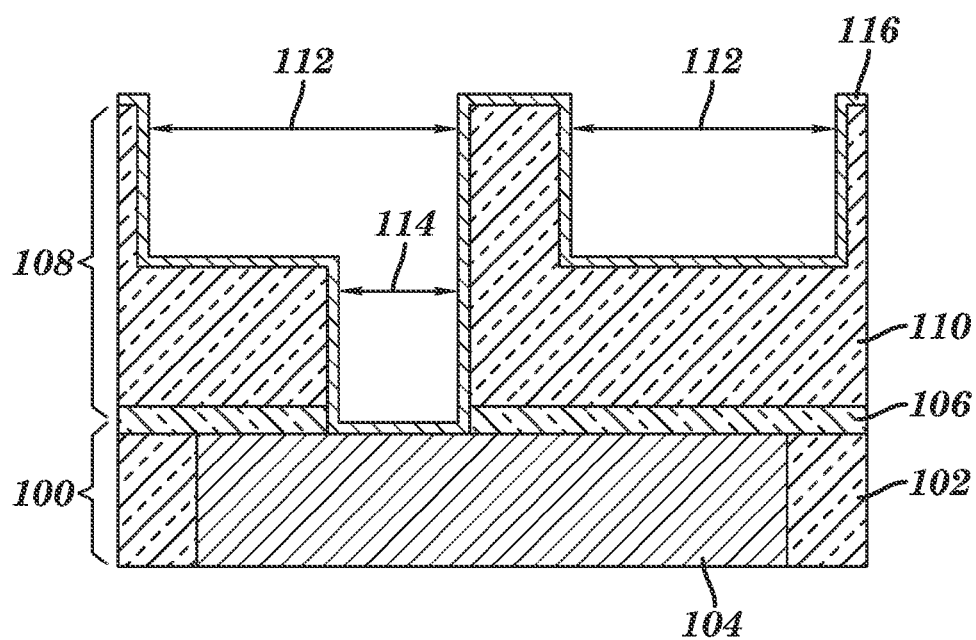
Figure 1C:
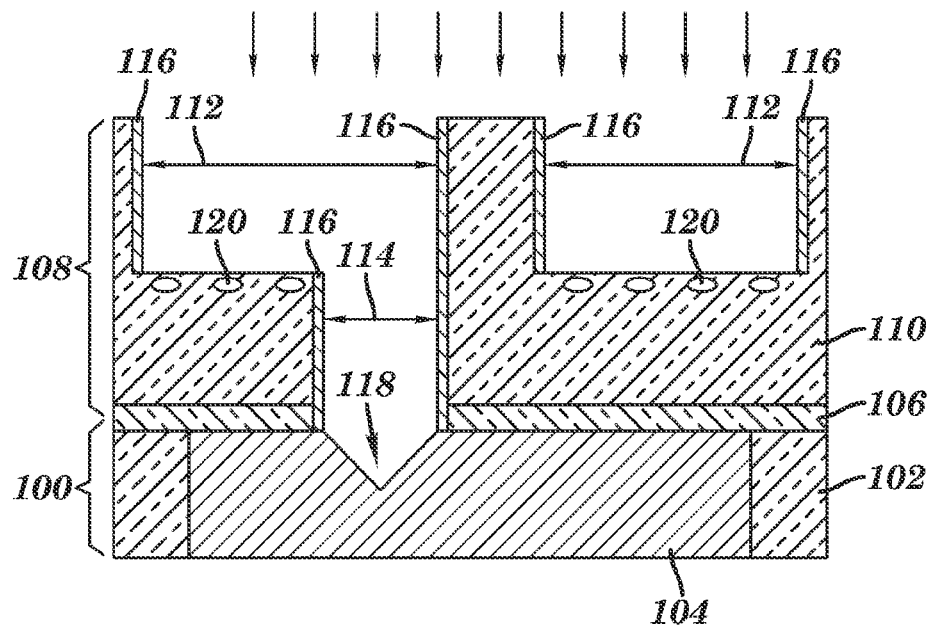
Figure 1D:
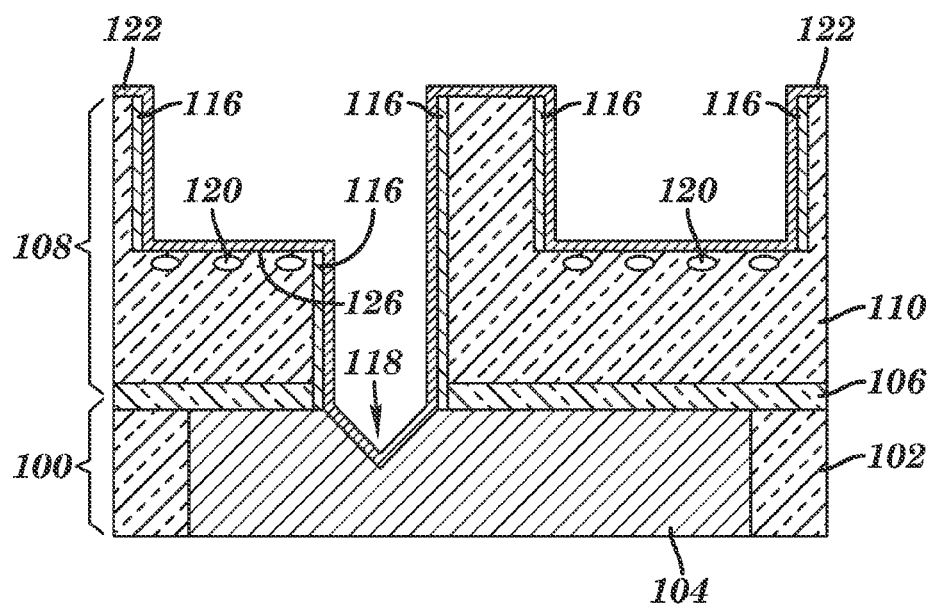
Figure 1E:
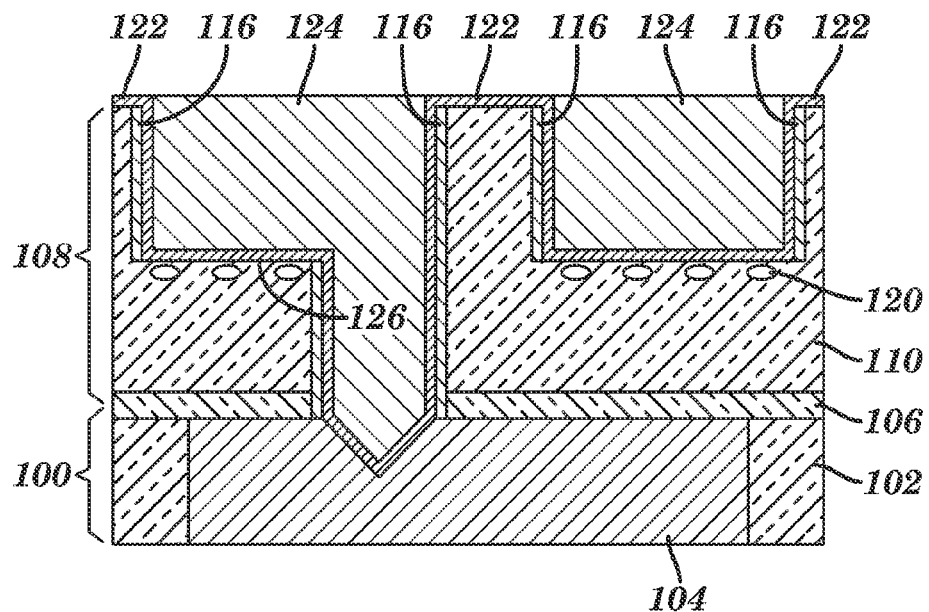

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF THE INVENTION

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

The present invention provides an interconnect structure in which at least one via has a via gouging feature and dielectric liner sidewalls. The via also has a metallic liner layer on top of the dielectric liner layer. The via is filled with a conductive material. The dielectric liner layer acts as an additional diffusion barrier layer which prevents the conductive filling material from diffusing into the dielectric material layer. As a result, the interconnect structure has an improved wiring reliability over the one fabricated with a conventional process discussed above.

The present invention also provides a method of forming an interconnect structure in which at least one via has a via gouging feature and dielectric liner sidewalls. In this method, a dielectric liner layer is coated on all exposed surfaces after the via gouging feature is formed, but before a line opening is formed. The dielectric liner layer can compensate the thickness loss of the dielectric material layer in the upper interconnect level which occurs during the process of forming the via gouging feature. In addition, the dielectric liner layer prevents an overlying planarization material layer from contaminating the conductive material layer in the lower interconnect level during the process of forming the line opening. Furthermore, during the line opening formation process, since there is no metal liner layer involved, the dielectric material layer of the upper interconnect level is subject to less harsh etch condition. As a result, there is a less chance for causing damages on the dielectric material layer.

Figure 2:
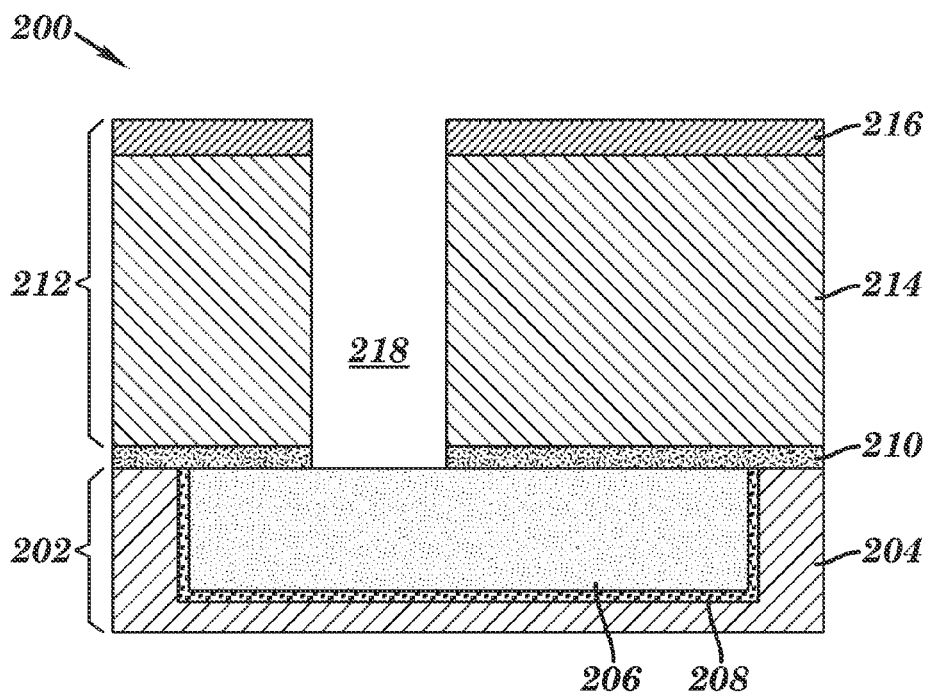
FIGS. 2-11 are cross-sectional views that illustrate the exemplary steps of a method of making an interconnect structure having a via with a via gouging feature and dielectric liner layer sidewalls, in accordance with embodiments of the present invention.

Referring to FIG. 2, an initial interconnect structure 200 is provided. The initial interconnect structure 200 includes a lower interconnect level 202 and an upper interconnect level 212 that are separated in part by a dielectric capping layer 210. The lower interconnect level 202 may be located above a semiconductor substrate (not shown) including one or more semiconductor devices. The lower interconnect level 202 includes a first dielectric layer 204 and at least one conductive material 206. The conduct material 206 forms a conductive region or feature embedded in the first dielectric layer 204. Preferably, the lower interconnect level 202 further includes a diffusion barrier layer 208 which separates the conductive material region 206 from the first dielectric material layer 204.

The upper interconnect level 212 of FIG. 2 includes a second dielectric layer 214 that has at least one via opening 218 located therein. The at least one via opening 218 exposes a portion of the conductive material 206 in the lower interconnect level 202. On top of the second dielectric layer is a patterned hard mask 216. The patterned hard mask 216 is used as an etch mask to form the at least one via opening 218 in the second dielectric layer 214. Although the structure shown in FIG. 2 illustrates a single via opening 218, the present invention contemplates forming any number of such via openings in the second dielectric layer 214 which may expose other conductive regions that may be present in the first dielectric layer 204.

The initial structure 200 maybe made by conventional techniques well known to those skilled in the art. For example, the initial interconnect structure 200 can be formed by first applying the first dielectric layer 204 to a surface of a substrate (not shown). The substrate may be a semiconducting material, an insulating material, a conducting material or a combination of two or more of the foregoing materials. When the substrate is comprised of a semiconducting material, a semiconductor material such as Si, SiGe, SiGeC, SiC, Ge alloys, GaAs, InAs, InP or other group III/V or II/VI semiconductor materials may be used. In addition to these listed types of semiconducting materials, the present invention also contemplates cases in which the substrate is a layered semiconductor such as, for example, Si/SiGe, Si/SiC, silicon-on-insulators (SOIs) or silicon germanium-on-insulators (SGOIs). When the substrate is a semiconducting material, one or more semiconductor devices such as, for example, complementary metal oxide semiconductor (CMOS) devices may be fabricated thereon.

When the substrate is an insulating material, the insulating material can be an organic insulator, an inorganic insulator or a combination of an organic insulator and an inorganic insulator. The substrate can be either single layer or multilayers.

When the substrate is a conducting material, the substrate may include, for example, polysilicon, an elemental metal, an alloy of elemental metals, a metal silicide, a metal nitride or a combination of two or more of the foregoing materials. The substrate can be either single layer or multilayers.

The first dielectric layer 204 of the lower interconnect level 202 may be any interlevel or intralevel dielectrics including inorganic dielectrics or organic dielectrics. The first dielectric layer 204 may be porous or non-porous. Examples of suitable dielectrics that can be used as the first dielectric layer 204 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

Preferably, the first dielectric layer 204 has a dielectric constant of about 4.0 or less. More preferably, the first dielectric layer 204 has a dielectric constant of about 2.8. These dielectrics generally have a lower parasitic crosstalk as compared with dielectric materials that have a dielectric constant higher than 4.0. The dielectric constants mentioned herein are measured in a vacuum.

The thickness of the first dielectric layer 204 may vary depending on the dielectric material used as well as the exact number of dielectrics within the lower interconnect level 202. Typically, and for normal interconnect structures, the first dielectric layer 204 has a thickness from about 200 nm to about 450 nm.

The conductive material 206 of the lower interconnect level 202 may form a conductive region or feature embedded in the first dielectric layer 204. The conductive region or feature may be formed by lithography. For example, a photoresist layer is applied to the surface of the first dielectric layer 204. The photoresist layer is exposed to a desired pattern of radiation. The exposed photoresist layer is developed utilizing a conventional resist developer. The patterned photoresist layer is used as an etch mask to transfer the pattern into the first dielectric layer 204. The etched region of the first dielectric layer 204 is then filled with conductive material 206 to form the conductive region or feature.

The conductive material 206 includes, but is not limited to, polysilicon, a conductive metal, an alloy of two or more conductive metals, a conductive metal silicide or a combination of two or more of the foregoing materials. Preferably, the conductive material 206 is a conductive metal such as Cu, W or Al. More preferably, the conductive material 206 is Cu or a Cu alloy (such as AlCu). The conductive material 206 is filled into the etched region of the first dielectric layer 204 using a conventional deposition process including, but not limited to, chemical vapor deposition (CVD), plasma enhanced chemical vapor deposition (PECVD), sputtering, chemical solution deposition or plating. After deposition, a conventional planarization process such as, for example, chemical mechanical polishing (CMP) can be used to provide a structure in which the conductive material 206 has an upper surface that is substantially coplanar with the upper surface of the first dielectric layer 204.

The conductive material 206 is preferably separated from the first dielectric layer 204 by a diffusion barrier layer 208. The diffusion barrier layer 208 may include, but is not limited to, Ta, TaN, Ti, TiN, Ru, RuTaN, RuTa, W, WN or any other material that can serve as a barrier to prevent a conductive material from diffusing into a dielectric material layer. The diffusion barrier layer 208 may be formed by a deposition process such as, for example, atomic layer deposition (ALD), CVD, PECVD, physical vapor deposition (PVD), sputtering, chemical solution deposition, or plating. The diffusion barrier layer 208 may also include a bilayer structure that includes a lower layer of a metallic nitride such as, for example, TaN and an upper metallic layer such as, for example, Ta.

The thickness of the diffusion barrier layer 208 may vary depending on the exact means of the deposition process as well as the material employed. Typically, the diffusion barrier layer 208 has a thickness from about 4 nm to about 40 nm, with a thickness from about 7 nm to about 20 nm being more typical.

After forming the at least one conductive feature comprising the conductive material 206 within the first dielectric layer 204, a dielectric capping layer 210 is formed on the surface of the lower interconnect level 202. The dielectric capping layer 210 is formed by a conventional deposition process such as, for example, CVD, PECVD, chemical solution deposition, or evaporation. The dielectric capping layer 210 may be any suitable dielectric capping material including, but not limited to, SiC, $Si_4NH_3$, $SiO_2$, a carbon doped oxide, a nitrogen and hydrogen doped silicon carbide (SiC (N,H)), or multilayers thereof. The thickness of the dielectric capping layer 210 may vary depending on the exact means of the deposition process as well as the material employed. Typically, the dielectric capping layer 210 has a thickness from about 15 nm to about 55 nm, with a thickness from about 25 nm to about 45 nm being more typical.

Next, the upper interconnect level 212 is formed by applying the second dielectric layer 214 on the upper exposed surface of the dielectric capping layer 210. The second dielectric layer 214 may be the same or different dielectric material as that of the first dielectric layer 204 of the lower interconnect level 202. Preferably the second dielectric layer 214 is the same dielectric material as that of the first dielectric layer 204. Examples of suitable dielectrics that can be used as the second dielectric layer 214 include, but are not limited to, $SiO_2$, silsesquioxanes, C doped oxides (i.e., organosilicates) that include atoms of Si, C, O and H, thermosetting polyarylene ethers, or multilayers thereof. Preferably, the second dielectric layer 214 has a dielectric constant of about 4.0 or less. More preferably, the second dielectric layer 214 has a dielectric constant of about 2.8 or less. The processing techniques and thickness ranges for the first dielectric layer 204 are also applicable here for the second dielectric layer 214.

The second dielectric layer 214 can also comprise two different materials, i.e., deposition of one dielectric material first, followed by deposition of a different dielectric material. In one embodiment of the present invention, the second dielectric layer 214 comprises two different low k dielectric materials, such as a porous low k dielectric material and a dense (or non-porous) low k dielectric material. Thus, the upper interconnect level 212 has a hybrid structure with the subsequently filled conductive line embedded in a porous low k dielectric material, and the subsequently filled via embedded in a dense low k dielectric material. In such an embodiment, the porous low k dielectric has a dielectric constant of about 2.8 or less, and the dense porous low k dielectric has a dielectric constant of about 4.0 or less.

Next, at least one via opening 218 is formed into the second dielectric layer 214 by first forming a patterned hard mask 216 atop the upper surface of the second dielectric layer 214. The hard mask 216 includes an oxide, nitride, oxynitride or a combination of two or more of the foregoing materials. The hard mask 216 may have a single layer or multilayer structure. Preferably, the hard mask 216 is an oxide such as $SiO_2$ or a nitride such as $Si_3N_4$. The hard mask 216 is formed utilizing a conventional deposition process such as, for example, CVD, PECVD, chemical solution deposition or evaporation. The thickness of the as-deposited hard mask 216 may vary depending upon the type of hard mask material formed, the number of layers that make up the hard mask layer 216 and the deposition technique used in forming the same. Typically, the as-deposited hard mask 216 has a thickness from about 10 nm to about 80 nm, with a thickness from about 20 nm to about 60 nm being even more typical.

The hard mask 216 is patterned by a lithographic process. A photoresist (not shown) is formed atop the hard mask 216 by a conventional deposition process such as, for example, spin-on coating or chemical solution deposition. The photoresist may be a positive-tone or a negative-tone photoresist. The photoresist is then subjected to a lithographic process which includes exposing the photoresist to a pattern of radiation and developing the exposed resist utilizing a conventional resist developer. The lithographic step provides a patterned photoresist atop the hard mask 216 that defines the width of the via opening 218. The via pattern is transferred into the hard mask 216 and then subsequently into the second dielectric layer 214 utilizing one or more etching processes.

The patterned photoresist can be stripped immediately after the via pattern is transferred into the hard mask 216 by utilizing a conventional stripping process. Alternatively, the patterned photoresist can be stripped after the via pattern is transferred into the second dielectric layer 214. The etching used in transferring the via pattern may comprise a dry etching process, a wet chemical etching process or a combination thereof. The term "dry etching" is used herein to denote an etching technique such as reactive-ion etching, ion beam etching, plasma etching, or laser ablation.

Figure 3A:
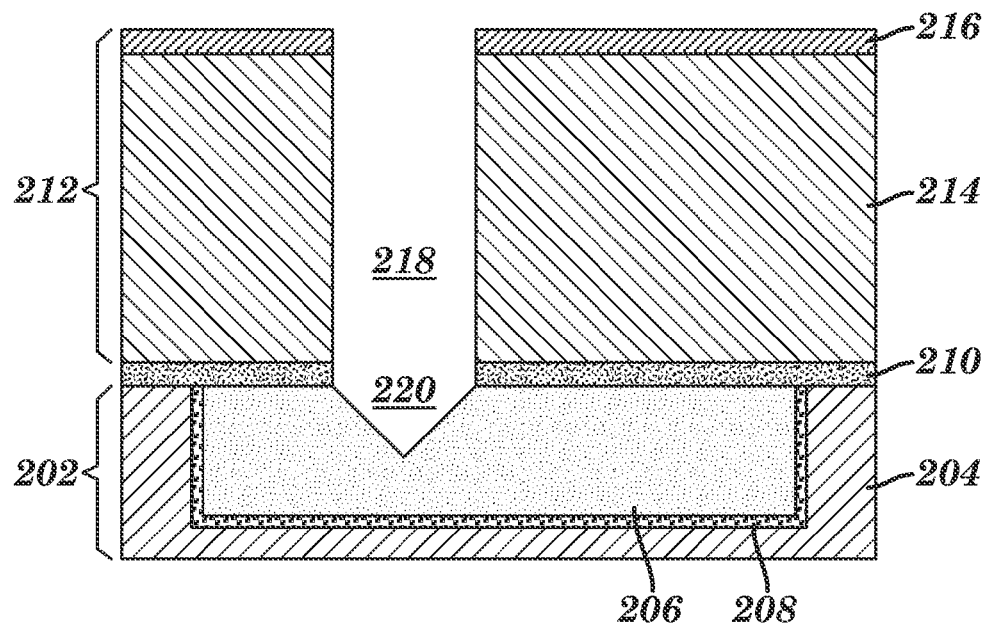
Figure 3B:
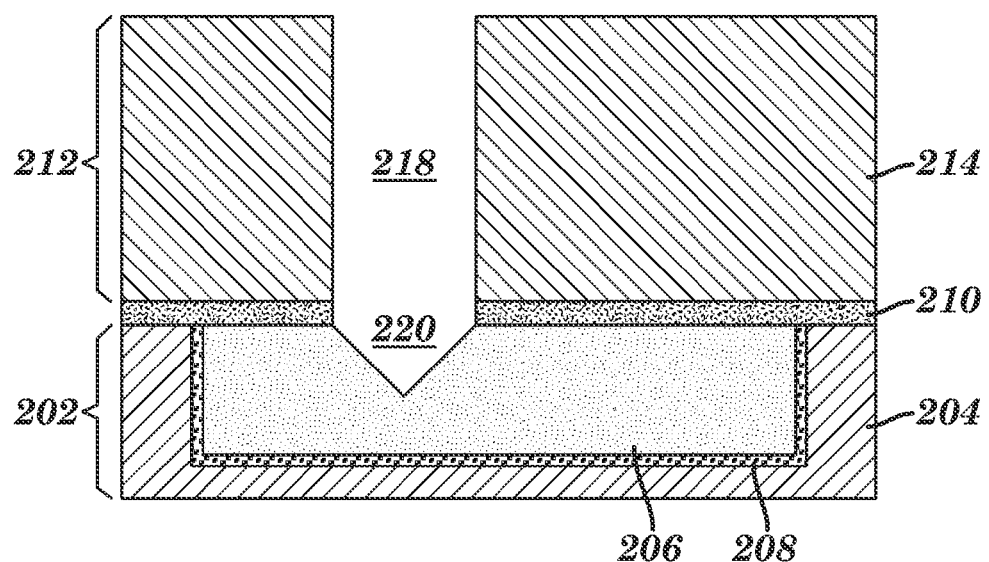

Referring now to FIGS. 3A and 3B, an ion-sputtering process is employed to remove an exposed portion of the conductive material 206 and create a via gouge feature 220 at the bottom of the via opening 218. The ion-sputtering is conducted with a gas source including, but not limited to, Ar, He, Xe, Ne, Kr, Rn, $N_2$ or $H_2$.

The ion-sputtering process used to create the via gouging feature 220 also removes a portion of the upper interconnect level 212. In one embodiment, as shown in FIG. 3A, the ion-sputtering process removes portion of the hard mask 216. In another embodiment, as shown in FIG. 3B, the ion-sputtering process completely removes the hard mask 216 and also removes portion of the second dielectric layer 214. In either case, the ion-sputtering process costs a thickness loss in the total dielectric stack which includes the hard mask 216 and the second dielectric layer 214.

Figure 4A:
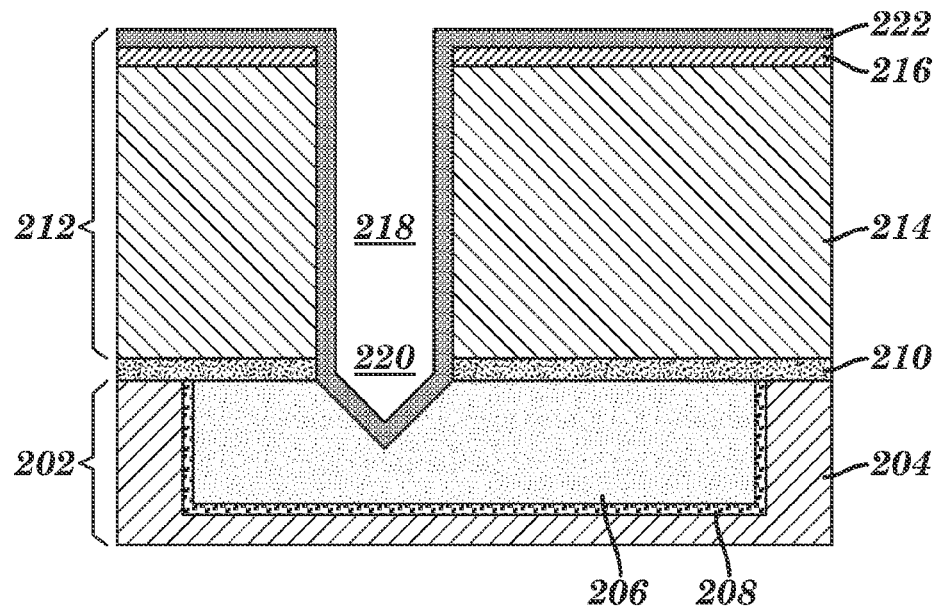
Figure 4B:
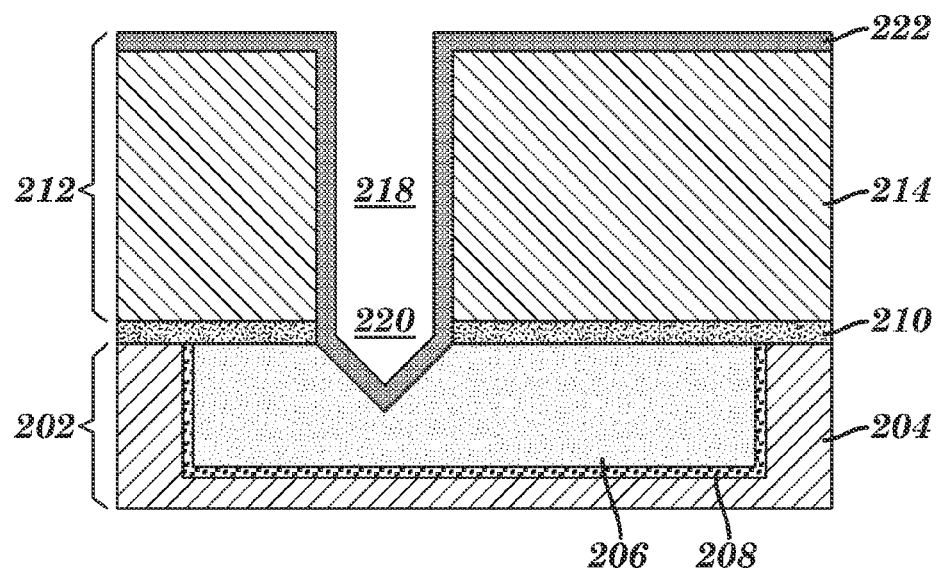

FIGS. 4A and 4B illustrate the structures of FIGS. 3A and 3B respectively after a dielectric liner layer 222 is formed on all exposed surfaces including the upper surface of the upper interconnect level 212 and the sidewalls and the bottom of the via opening 218. The dielectric liner layer 222 increases the thickness of the total dielectric stack and compensates the thickness loss of the total dielectric stack which occurs during the ion-sputtering process.

The dielectric liner layer 222 can be a dielectric material. Suitable dielectric materials for the dielectric liner layer 222 include, but are not limited to, $SiO_2$, $Si_3N_4$, SiC, a nitrogen and hydrogen doped silicon carbide (SiC(N, H)), and all other dielectric materials commonly used in the semiconductor industry.

The dielectric liner layer 222 may be formed by a CVD process, a PECVD process, an ALD process, or a plasma enhanced atomic layer deposition (PEALD) process.

The thickness of the dielectric liner layer 222 may vary depending on the exact means of the deposition process as well as the material employed. Typically, the dielectric liner layer 222 has a thickness from about 2 nm to about 100 nm, with a thickness from about 5 nm to about 20 nm being more typical.

Figure 5:
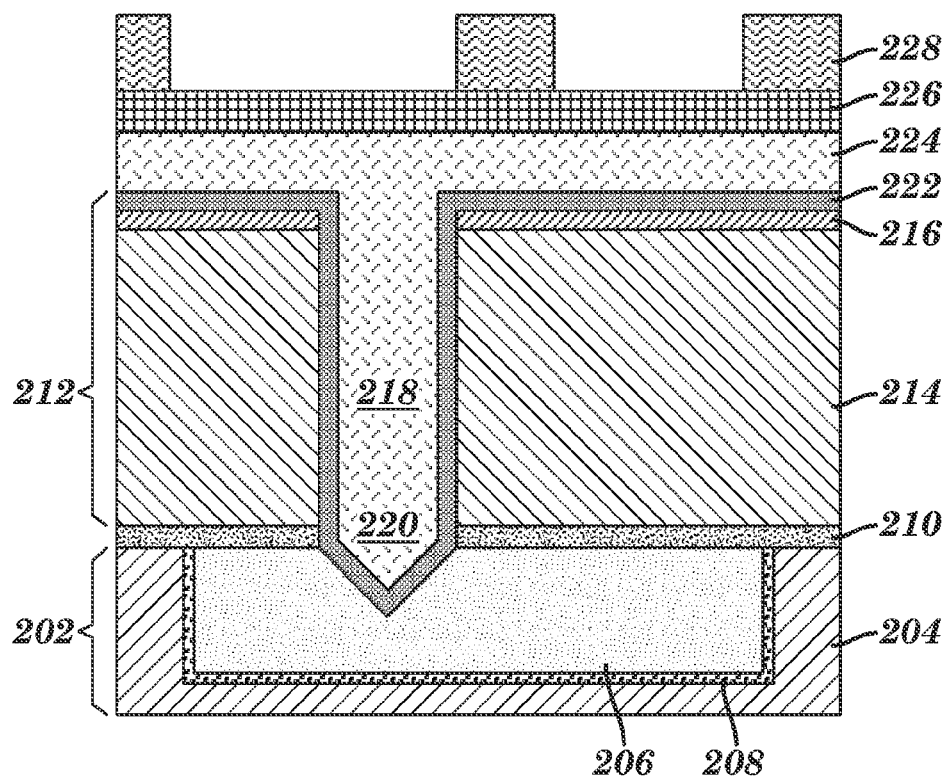
Figure 6:
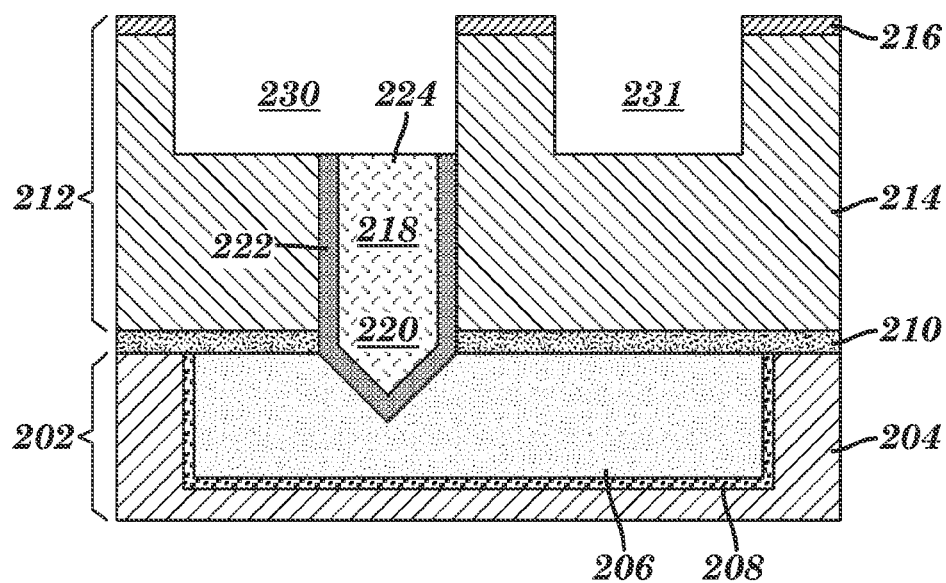

In FIGS. 5 and 6, a line opening 230 is formed in the second dielectric layer 214. The line opening 230 extends above the via opening 218. Optionally, a second line opening 231 is also formed in the second dielectric layer 214. The second line opening 231 is away from, and not overlying, the via opening 218.

Line openings 230 and 231 are formed by a lithographic process known in the art. As shown in FIG. 5, the via opening 218 may be filled with a material 224 suitable for planarization. Material 224 may include, but not limited to, OPL (organic planarizing layer), IPL (inorganic planarizing layer), ARC (anti-reflective coating) or combinations thereof. A top surface of material 224 may then be planarized. On the planarized top surface of material 224, a second hard mask 226 may be formed.

Next, a photoresist layer is formed atop the hard mask 226 by a conventional deposition process such as, for example, spin-on coating or chemical solution deposition. The photoresist layer may be a positive-tone or a negative-tone photoresist. The photoresist is then subjected to a lithographic process which includes exposing the photoresist to a pattern of radiation and developing the exposed resist utilizing a conventional resist developer. The lithographic step provides a patterned photoresist 228 atop the hard mask 226 that defines the width of the line openings 230 and 231.

In FIG. 6, the line patterns are transferred into the hard mask 226 and then subsequently into the second dielectric layer 214 utilizing one or more etching processes. As shown in FIG. 6, the one or more etching processes form line openings 230 and 231 in the second dielectric layer 214. In accordance with the present invention, at least one of the line openings 230 is located above and connect to the via opening 218, which is protected by the remaining planarization material 224. The one or more etching processes remove, in sequential order, exposed portions of the second hard mask 226, the underlying portions of the planarization material 224, and exposed portions of the second dielectric layer 214. The patterned photoresist 228 and the patterned second hard mask 226 are typically consumed during the above mentioned etching processes.

As shown in FIG. 6, the conductive material 206 in the lower interconnect level 202 is separated from the planarization material 224 by the dielectric liner layer 222. The existence of the dielectric liner layer 222 can prevent potential contamination of the conductive material 206 by the planarization material 224, and therefore enhances reliability of the final interconnect structure.

Figure 7:
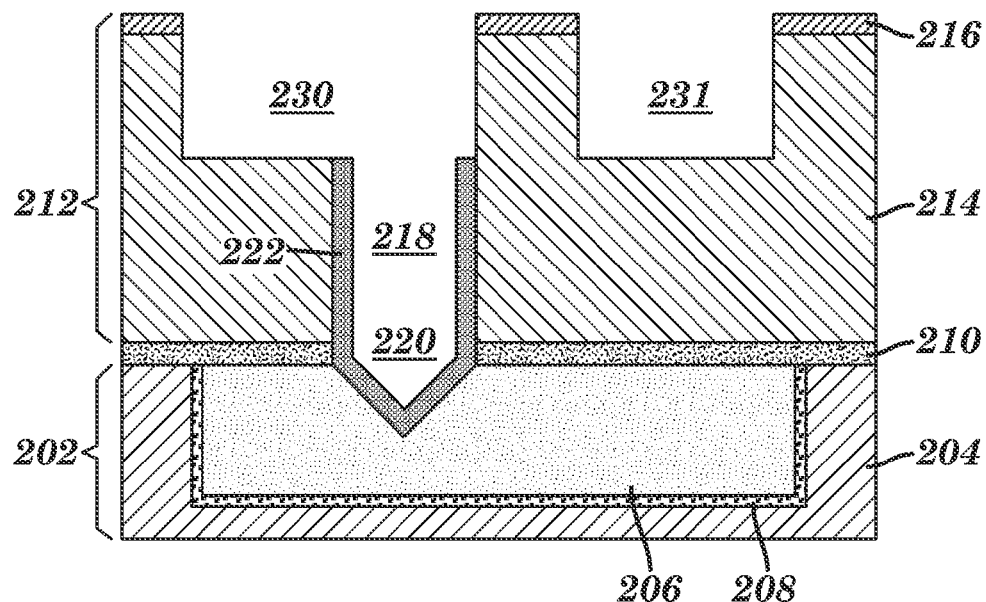

FIG. 7 shows the structure of FIG. 6 after the remaining planarization material 224 is stripped from the via opening 218. The stripping of the remaining planarization material 224 is performed by either a chemical wet etching process or a chemical ashing process that is selective in removing the planarization material 224 from the structure.

Figure 8:
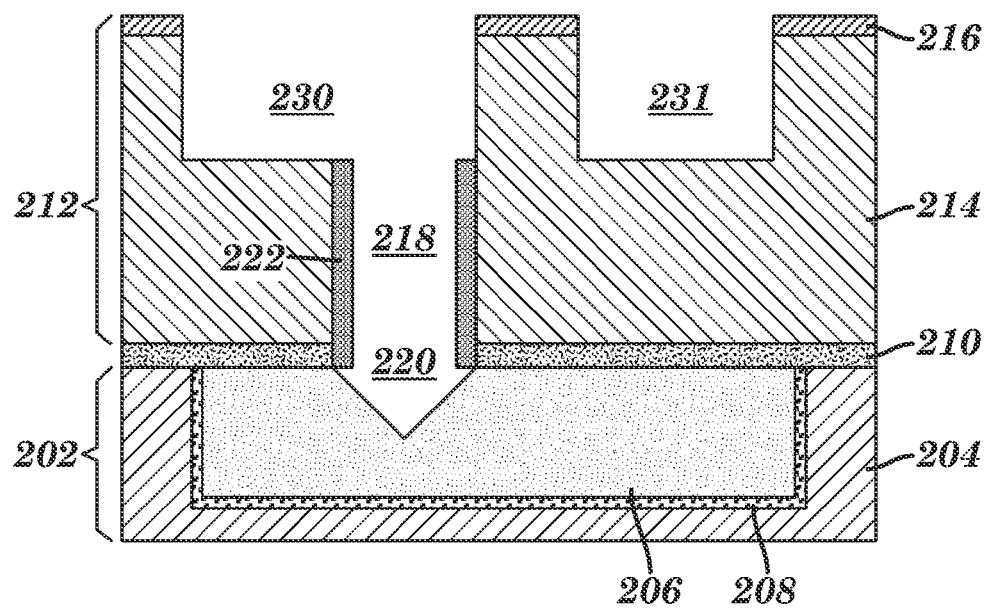

After stripping of the remaining planarization material 224, a portion of the dielectric liner layer 222 is selectively removed. As shown in FIG. 8, the selective removing process only removes the portion of the dielectric liner layer 222 at the via gouging feature 220 located at the bottom the via opening 218, while keeping the portion of the dielectric liner layer 222 at sidewalls of the via opening 218 unremoved.

The selective removing process includes, but is not limited to, a plasma stripping process, a wet chemical etching process, and an ion-sputtering process with a gas resource. When the selective removing process is a plasma stripping process, the plasma stripping process includes a hydrogen plasma stripping process. When the selective removing process is a wet chemical etching process, the process includes a wet chemical etching process with a dilute HF solution, a dilute HCl solution, a $H_2O_2$ solution, or a combination comprising two or more of the foregoing solutions. When the selective removing process is an ion-sputtering process with a gas resource, the gas source may include Ar, He, Xe, Ne, Kr, Rn, $N_2$ or $H_2$.

Figure 9:
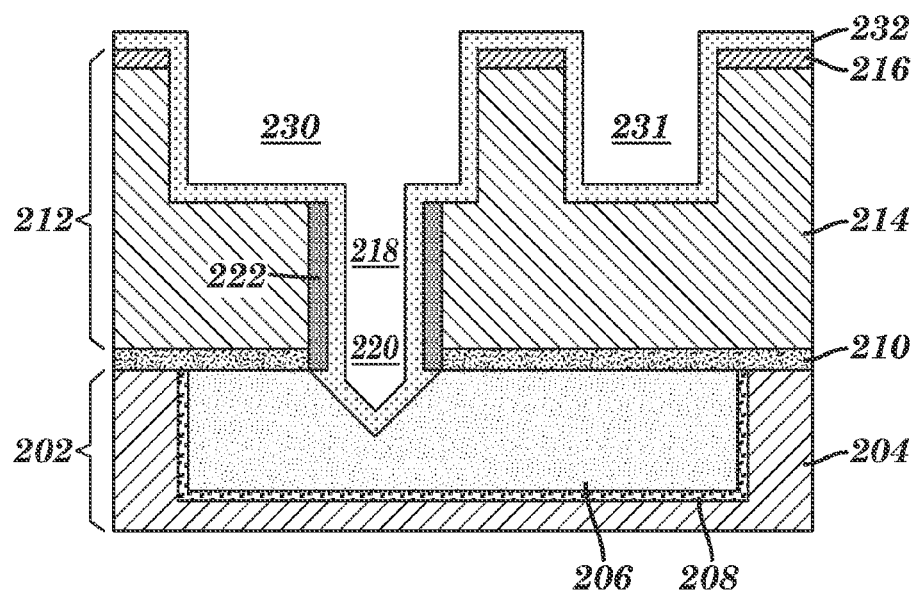

After the portion of the dielectric liner layer 222 at the via gouging feature 220 located at the bottom the via opening 218 is selectively removed, a diffusion barrier layer 232 is formed on all exposed surfaces of the structure, including the exposed surfaces of the line openings 230 and 231, the via opening 218 and the via gouging feature 220 (FIG. 9). The diffusion barrier layer 232 may include, but is not limited to, Ta, TaN, Ti, TiN, Ru, RuN, RuTa, RuTaN, W, WN, Co, CoW, Mn, MnO, a combination comprising two or more of the foregoing materials or any other material that can serve as a barrier to prevent a conductive material from diffusing there through. Combinations of these materials are also contemplated to form a multilayered stacked diffusion barrier layer.

The diffusion barrier layer 232 is formed utilizing a deposition process such as, for example, ALD, CVD, PECVD, PVD, sputtering, chemical solution deposition, or plating. It is noted that the diffusion barrier layer 232 is continuously present in the line openings 230 and 231 throughout the inventive process.

The thickness of the diffusion barrier layer 232 may vary depending on the number of material layers within the barrier layer, the technique used in forming the same as well as the material of the diffusion barrier layer itself. Typically, the diffusion barrier layer 232 has a thickness from about 4 nm to about 40 nm, with a thickness from about 7 nm to about 20 nm being more typical.

An optional adhesion/plating seed layer (not shown) can be located atop the diffusion barrier layer 232. The optional adhesion/plating seed layer is comprised of a metal or metal alloy from Group VIIIA of the Periodic Table of Elements. Examples of suitable Group VIIIA elements for the adhesion/plating seed layer include, but are not limited to, Ru, TaRu, Ir, Rh, Pt, Pd, Co and alloys thereof. In some embodiments, it is preferred to use Ru, Ir, Co or Rh as the adhesion/plating seed layer.

The adhesion/plating seed layer is formed by a conventional deposition process including, for example, CVD, PECVD, ALD, plating, sputtering and PVD. The thickness of the adhesion/plating seed layer may vary depending on number of factors including, for example, the compositional material of the adhesion/plating seed layer and the technique that was used in forming the same. Typically, the adhesion/plating seed layer has a thickness from about 0.5 nm to about 10 nm, with a thickness of about 0.5 nm to about 6 nm being more typical.

Figure 10:
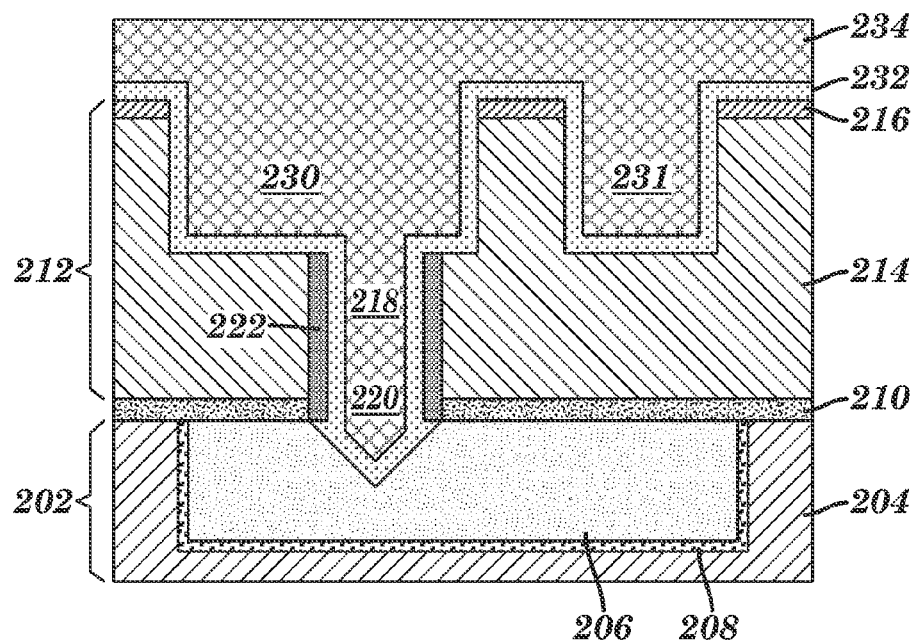

In FIG. 10, the line openings 230 and 231, the via opening 218 as well as the via gouging feature 220 are filled with a second conductive material 234. The second conductive material 234 may be the same or different, preferably the same, conductive material as that of the first conductive material 206. Preferably, the second conductive material 234 is Cu, Al, W or an alloy of two or more of the foregoing metals. More preferably, the second conductive material 234 is Cu or AlCu alloy. It is noted that when polysilicon is used as the conductive material 234, the adhesion/plating seed layer is typically not used. On the other hand, when other types of conductive materials are used as the conductive material 234, the adhesion/plating seed layer is typically used. The second conductive material 234 is formed utilizing the same deposition processing as described above in forming the first conductive material 206. As shown, the second conductive material 234 extends above the upper surface of the second dielectric layer 214.

Figure 11:
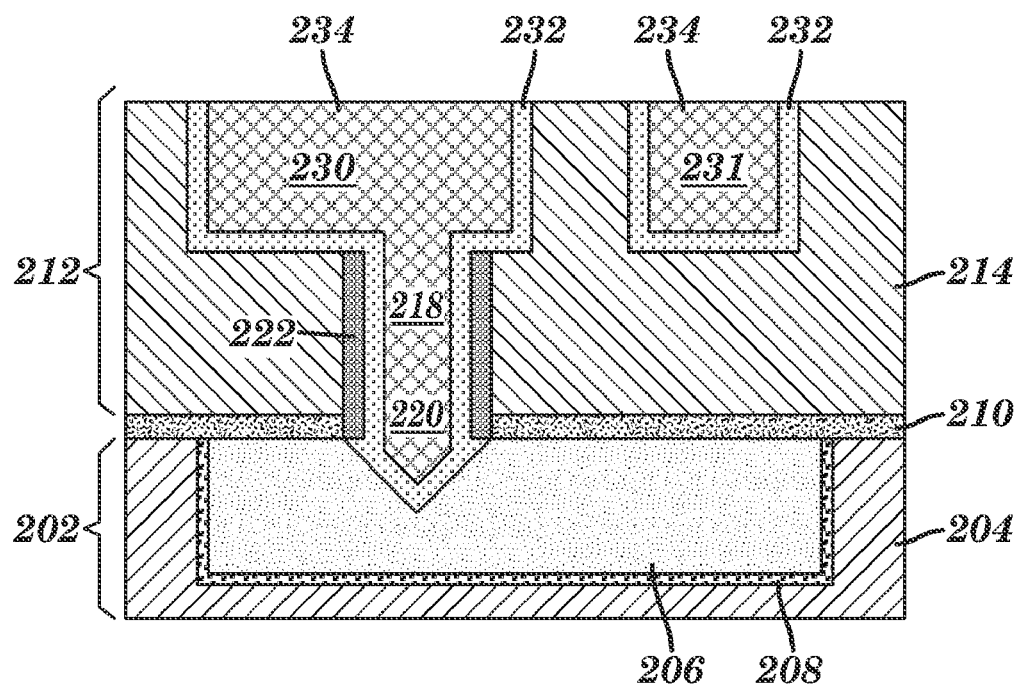

Next, the structure shown in FIG. 10 is subjected to a planarization which provides the planar interconnect structure shown in FIG. 11. The planarization process removes various materials that are located atop the second dielectric layer 214 of the upper interconnect level 212. Chemical mechanical polishing (CMP) and/or grinding may be used in this step of the present invention.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming an interconnect structure comprising:
    providing an initial interconnect structure that includes a lower interconnect level comprising a first dielectric layer having a first conductive material embedded therein, an upper interconnect level comprising a second dielectric layer having at least one via opening that exposes a portion of said first conductive material located atop said lower interconnect level, said lower and upper interconnect levels are separated in part by a dielectric capping layer, and a patterned hard mask on a surface of the said upper interconnect level;
    removing an exposed portion of said conductive material to form at least one via gouging feature within said conductive material at a bottom of said at least one via opening;
    forming a dielectric liner layer on all exposed surfaces;
    forming at least one line opening in said second dielectric layer that extends above said at least one via opening;
    selectively removing said dielectric liner layer from said at least one via gouging feature while keeping at least a portion of said dielectric liner layer at sidewalls of said at least one via opening unremoved;
    forming a first diffusion barrier layer on all exposed surfaces; and
    filling said at least one line opening and at least one via opening with a second conductive material.

2. The method of claim 1, wherein said providing said initial interconnect structure comprises:
    forming said first conductive material within said first dielectric layer;
    forming a dielectric capping layer on said first dielectric layer and said first conductive material;
    forming said second dielectric layer on said dielectric capping layer;
    forming a patterned hard mask having via patterns on said second dielectric layer; and
    transferring said via patterns into said second dielectric material layer said dielectric capping layer.

3. The method of claim 2, further comprising, before said forming said first conductive material, forming a second diffusion barrier within said first dielectric layer.

4. The method of claim 1, wherein said forming said at least one via gouging feature comprises ion-sputtering with a gas source.

5. The method of claim 4, wherein said gas source comprises Ar, He, Xe, Ne, Kr, Rn, $N_2$ or $H_2$.

6. The method of claim 1, wherein said dielectric liner layer comprises a dielectric material.

7. The method of claim 6, wherein said dielectric liner layer comprises $SiO_2$, $Si_3N_4$, SiC, or a nitrogen and hydrogen doped silicon carbide (SiC(N, H)).

8. The method of claim 1, wherein said forming said dielectric liner layer comprises a chemical vapor deposition (CVD), a plasma enhanced chemical vapor deposition (PECVD), an atomic layer deposition (ALD) process, or a plasma enhanced atomic layer deposition (PEALD).

9. The method of claim 1, wherein said dielectric liner layer has a thickness in the range from about 2 nm to about 100 nm.

10. The method of claim 9, wherein said dielectric liner layer has a thickness in the range from about 5 nm to about 20 nm.

11. The method of claim 1, wherein said selectively removing said dielectric liner layer comprises a plasma stripping process, a wet chemical etching process, or an ion-sputtering process with a gas resource.

12. The method of claim 11, wherein said plasma stripping process comprises a hydrogen plasma stripping process.

13. The method of claim 11, wherein said wet chemical etching process comprises a wet chemical etching process with a dilute HF solution, a dilute HCl solution, a $H_2O_2$ solution, or a combination comprising two or more of the foregoing solutions.

14. The method of claim 11, wherein said gas source comprises Ar, He, Xe, Ne, Kr, Rn, $N_2$ or $H_2$.

* * * * *